United States Patent
Takahashi et al.

(10) Patent No.: US 12,410,514 B2
(45) Date of Patent: Sep. 9, 2025

(54) VAPOR DEPOSITION SOURCE MATERIAL USED IN PRODUCTION OF FILM CONTAINING INDIUM AND ONE OR MORE OF THE OTHER METALS, AND THE METHOD OF PRODUCING FILM CONTAINING INDIUM AND ONE OR MORE OF THE OTHER METALS

(71) Applicant: KOJUNDO CHEMICAL LABORATORY CO., LTD., Sakado (JP)

(72) Inventors: Nobutaka Takahashi, Sakado (JP); Fumikazu Mizutani, Sakado (JP); Shintaro Higashi, Sakado (JP)

(73) Assignee: KOJUNDO CHEMICAL LABORATORY CO., LTD., Sakado (JP)

( * ) Notice: Subject to any disclaimer, the term of this patent is extended or adjusted under 35 U.S.C. 154(b) by 79 days.

(21) Appl. No.: 18/254,687

(22) PCT Filed: Nov. 26, 2021

(86) PCT No.: PCT/JP2021/043311
§ 371 (c)(1),
(2) Date: May 26, 2023

(87) PCT Pub. No.: WO2022/118744
PCT Pub. Date: Jun. 9, 2022

(65) Prior Publication Data
US 2024/0003004 A1 Jan. 4, 2024

(30) Foreign Application Priority Data

Dec. 4, 2020 (JP) ................................. 2020-201422
Nov. 24, 2021 (JP) ................................. 2021-189893

(51) Int. Cl.
*C23C 16/40* (2006.01)
*C23C 16/455* (2006.01)

(52) U.S. Cl.
CPC ...... *C23C 16/407* (2013.01); *C23C 16/45553* (2013.01)

(58) Field of Classification Search
CPC .................................................. C23C 16/4488
See application file for complete search history.

(56) References Cited

U.S. PATENT DOCUMENTS

| | | | |
|---|---|---|---|
| 4,720,560 | A | 1/1988 | Hui et al. |
| 2009/0087936 | A1 | 4/2009 | Miki et al. |
| 2012/0298040 | A1* | 11/2012 | Woelk ............... C23C 16/45557 427/248.1 |
| 2013/0171341 | A1* | 7/2013 | Park ........................ C07F 17/00 427/126.3 |
| 2019/0203357 | A1* | 7/2019 | Mizutani ........... C23C 16/45553 |
| 2020/0181775 | A1 | 6/2020 | Mizutani et al. |
| 2022/0243319 | A1* | 8/2022 | Ono ........................ C07F 5/00 |

FOREIGN PATENT DOCUMENTS

| | | |
|---|---|---|
| JP | S61104079 A | 5/1986 |
| JP | 2007053186 A | 3/2007 |
| JP | 2008091470 A | 4/2008 |
| JP | 2012244168 A | 12/2012 |
| JP | 2018090855 A | 6/2018 |
| JP | 2020143316 A | 9/2020 |
| TW | 201305381 A | 2/2013 |
| TW | 201600629 A | 1/2016 |
| WO | 2015145907 A1 | 10/2015 |
| WO | 2018225668 A1 | 12/2018 |

OTHER PUBLICATIONS

Cho et al., "Comparative Study on Performance of IGZO Transistors With Sputtered and Atomic Layer Deposited Channel Layer", IEEE Transactions on Electron Devices, vol. 66, No. 4, Apr. 2019, pp. 1783-1788.
International Search Report (PCT/ISA/210) with English translation and Written Opinion (PCT/ISA/237) mailed on Jan. 25, 2022, by the Japanese Patent Office as the International Searching Authority for International Application No. PCT/JP2021/043311.

* cited by examiner

*Primary Examiner* — Austin Murata
(74) *Attorney, Agent, or Firm* — BUCHANAN INGERSOLL & ROONEY PC

(57) ABSTRACT

Provided are a CVD source material used in production of a film containing indium and one or more of the other metals, which is stably preservable over the long term and easily handled, and a production method thereof. The CVD source material comprises ≥0.1 mol of one or more compounds of formulae (3) to (6) on the 100 mol basis of a compound of formula (1) or (2). $In(C_5H_4R)$ ... (1), $In(C_5(CH_3)_4R)$ ... (2), $M^1(C_5H_4R)$ ... (3), $M^2(C_5H_4R)_n$ ... (4), $M^1(C_5(CH_3)_4R)$ ... (5), and $M^2(C_5(CH_3)_4R)_n$ ... (6). In formulae (1) to (6), each R is independently hydrogen or an alkyl group having 1 to 6 carbons, in formulae (3) and (5), $M^1$ is a metal excluding indium, in formulae (4) and (6), $M^2$ is a metal excluding indium and n is an integer of 2 to 4.

3 Claims, No Drawings

VAPOR DEPOSITION SOURCE MATERIAL USED IN PRODUCTION OF FILM CONTAINING INDIUM AND ONE OR MORE OF THE OTHER METALS, AND THE METHOD OF PRODUCING FILM CONTAINING INDIUM AND ONE OR MORE OF THE OTHER METALS

TECHNICAL FIELD

The present invention relates to a chemical vapor deposition source material used in the production of a film containing indium and one or more of the other metals by chemical vapor deposition (CVD).

BACKGROUND ART

Transparent conductive films are used for electrodes of solar cells, liquid crystal display devices, and various other light-receiving elements, because of their conductivity and excellent visible light transmission. They are also used for reflection films for windowpanes of automobiles and buildings, various antistatic films and so forth by making use of their reflection/absorption characteristics in the near infrared ray region.

Generally, zinc oxide which contains aluminum, gallium, indium or tin as a dopant, and indium oxide which contains tin, tungsten or titanium as a dopant are used for transparent conductive films. In particular, indium oxide film containing tin as a dopant is called ITO film and widely used for industry as low-resistant transparent conductive film. These days, a crystalline oxide semiconductor called IGZO, or a composite oxide film composed of indium, gallium and zinc is installed in thin film transistor (TFT) for a liquid crystal panel.

The foregoing ITO film and IGZO film are formed by physical vapor deposition (PVD) and chemical vapor deposition (CVD). And, besides, films with uniform thickness with atomic precision can be formed on the uneven surface of an organic flexible board by atomic layer deposition (ALD) which is one of chemical vapor deposition (CVD) (e.g., NPL 1).

Many indium materials for such deposition processes are often used in the solid state at the feeding temperature. But as to a material in the film-forming process, liquid materials are superior to solid materials, owing to easy feeding of the vapor with uniform density. PTL 1 discloses the method of forming an indium oxide ($In_2O_3$) film by high-temperature ALD method which can provide an indium-containing film with high-throughput, by making use of an indium compound having an alkylcyclopentadienyl moiety and ozone. PTL 1 discloses that the introduction of a branched hydrocarbon group as a substituent into a cyclopentadienyl ligand enables stability to light and heat to improve.

There are some reports on liquid source materials for the formation of indium oxide films. According to PTL 2, alkylcyclopentadienylindium (I), though it is unstable as a source material, gets stabilized in contact with a very small amount of oxygen before being filled in a sealed vessel, and is preservable over the long term.

According to PTL 3, alkylcyclopentadienylindium (I) as a main component is stabilized by allowing with any one or more of alkylcyclopentadiene, dialkylcyclopentadiene, trisalkylcyclopentadienylindium (III) and triscyclopentadienylindium (III) to coexist as secondary components.

Indium compounds can be stabilized by introducing a branched alkyl substituent into a cyclopentadienyl group as disclosed in PTL 1. However, as to indium compounds reported in PTL 1, thermal gravity analysis (TGA) in Example 1 shows that 99.4% of the indium compound evaporates up to 200° C., leaving a 0.6% residue, which indicates that the indium compounds does not thermally decompose. But they leave non-negligible amounts of residues. It means that the indium compound gradually may have such a reaction as disproportionation that produces residues. The required stability for the deposition source material is not sufficient, and the deposition source material needs much longer-term stability. The indium compounds containing S, Ge and N and the indium compounds having non-cyclopentadienyl C-rich ligands as described in PTL 1 may have fear of these elements left behind.

The methods described in PTLs 2 and 3 have problems in which adjustments are complicated. In case oxygen, trisalkylcyclopentadienylindium (III) and so forth remain, they may react with other metal source materials.

Several metallic materials need to be added individually to form composite oxide films, such as an IGZO film, which makes the film formation process complicated and equipment on a large scale. In order to simplify the film formation process, liquid source materials have been desired for chemical vapor deposition, because they are easy to store, handle and feed.

CITATION LIST

Patent Literature

PTL 1: JP 2020-143316 A
PTL 2: JP 2018-90855 A
PTL 3: WO 2018/225668 A

Non-Patent Literature

NPL 1: IEEE Transactions on Electron Devices, 2019, 66, 4, 1783-1788

SUMMARY OF INVENTION

Technical Problem

The object of the present invention is to provide a chemical vapor deposition source material to produce a film containing indium and one or more of the other metals by chemical vapor deposition, which is stably preservable over the long term and easily handled, and a production method thereof.

Solution to Problem

The chemical vapor deposition source material of the present invention, which is used in the production of a film containing indium and one or more of the other metals, comprises not less than 0.1 mol of one or more compounds represented by the following general formulae (3) to (6) on the 100 mol basis of a compound represented by the following general formula (1) or (2):

$$In(C_5H_4R) \tag{1}$$

$$In(C_5(CH_3)_4R) \tag{2}$$

$$M^1(C_5H_4R) \tag{3}$$

$$M^2(C_5H_4R)_n \tag{4}$$

$$M^1(C_5(CH_3)_4R) \quad (5)$$

$$M^2(C_5(CH_3)_4R)_n \quad (6)$$

In the general formulae (1) to (6), each R is independently a hydrogen atom or an alkyl group having 1 to 6 carbon atoms, in the general formulae (3) and (5), $M^1$ is a metal excluding indium, in the general formulae (4) and (6), $M^2$ is a metal excluding indium, and n is an integer of 2 to 4. The $(C_5H_4R)$ and $(C_5(CH_3)_4R)$ represent ligands for a metal.

Preferably, in the general formulae (3) and (5), $M^1$ is gallium, and in the general formulae (4) and (6), $M^2$ is zinc or tin.

Preferably, the chemical vapor deposition source material comprises the compound represented by the general formula (1), and the compound represented by the general formula (3) and/or (4), or comprises the compound represented by the general formula (2), and the compound represented by the general formula (5) and/or (6); provided, however, that R is the same in the general formulae (1) to (6). Compounds having different ligands should not be contained for fear of a ligand exchange.

It is preferable that the chemical vapor deposition source material preferably further should comprise a solvent in addition to the compound represented by the general formula (1) or (2) and one or more of the compounds represented by general formulae (3) to (6). The total concentration of the compound represented by the general formula (1) or (2) and one or more of the compounds represented by the general formulae (3) to (6) is preferably 0.01 wt % or more in the vapor deposition source material.

The producing method of the present invention is to form a film containing indium and one or more of the other metals using the chemical vapor deposition source material by chemical vapor deposition.

Advantageous Effects of Invention

According to the present invention, mixing a compound represented by the general formula (1) or (2) with one or more compounds represented by the general formulae (3) to (6) enables the obtained vapor deposition source material to be stably preserved from several days to a few months at room temperature (23° C.). The present invention can facilitate the formation of a composite oxide film comprising indium and metals excluding indium.

DESCRIPTION OF EMBODIMENTS

Hereinafter, the present invention will be described in detail.

The chemical vapor deposition source material used in the production of a film (hereinafter referred to simply as "vapor deposition source material") of the present invention comprises not less than 0.1 mol of one or more compounds represented by the following general formulae (3) to (6) on the 100 mol basis of a compound represented by the following general formula (1) or (2), or a monovalent indium compound. It is especially good for the present invention that the film containing indium and one or more of the other metals should be an oxide.

$$In(C_5H_4R) \quad (1)$$

$$In(C_5(CH_3)_4R) \quad (2)$$

$$M^1(C_5H_4R) \quad (3)$$

$$M^2(C_5H_4R)_n \quad (4)$$

$$M^1(C_5(CH_3)_4R) \quad (5)$$

$$M^2(C_5(CH_3)_4R)_n \quad (6)$$

In the general formulae (1) to (6), R is a hydrogen atom or an alkyl group having 1 to 6 carbon atoms.

The alkyl group having 1 to 6 carbon atoms includes a methyl group, an ethyl group, a n-propyl group, an isopropyl group, a n-butyl group, an isobutyl group, a s-butyl group, a t-butyl group, a n-pentyl group, a neopentyl group, an isopentyl group, a s-pentyl group, a 3-pentyl group, a t-pentyl group, a n-hexyl group, a 2-methylpentyl group, a 3-methylpentyl group, a 2,2-dimethylbutyl group and a 2,3-dimethylbutyl group. Among these alkyl groups, a methyl group, an ethyl group and a n-propyl group are preferable, an ethyl group and a n-propyl group still preferable, and a n-propyl group particularly preferable.

In the general formulae (3) and (5), $M^1$ is a metal excluding indium. $M^1$ is a monovalent metal, the group 13 metal preferably, and gallium most preferably.

In the general formulae (4) and (6), n is an integer of 2 to 4 and $M^2$ is a metal excluding indium. $M^2$ is a divalent, trivalent or tetravalent metal. Considering the steric hindrance of ligands, $M^2$ should be of low valence and a divalent metal preferably, and more preferably $M^2$ belongs to the group 12, 13 or 14, though not particularly limited. Among the groups 12, 13 and 14 metals, the metals belonging to the period 2, 3 or 4, specifically gallium, zinc, germanium and tin are still preferable. Among them, zinc and tin are most preferable.

Specific examples of the compound represented by the general formula (1) include cyclopentadienylindium (I), methylcyclopentadienylindium (I), ethylcyclopentadienylindium (I), n-propylcyclopentadienylindium (I), isopropylcyclopentadienylindium (I) and t-butylcyclopentadienylindium (I). Methylcyclopentadienylindium (I) and ethylcyclopentadienylindium (I) are still preferable. Ethylcyclopentadienylindium (I) is particularly preferable.

Specific examples of the compound represented by the general formula (2) include tetramethylcyclopentadienylindium $(InC_5H(CH_3)_4)$, pentamethylcyclopentadienylindium $(InC_5(CH_3)_5)$, tetramethyl-ethylcyclopentadienylindium $(InC_5(CH_3)_4(C_2H_5))$, tetramethyl-n-propylcyclopentadienylindium $(InC_5(CH_3)_4(n-C_3H_7))$, tetramethyl-isopropylcyclopentadienylindium $(InC_5(CH_3)_4(iso-C_3H_7))$ and tetramethyl-n-butylcyclopentadienylindium $(InC_5(CH_3)_4(n-C_4H_9))$. Pentamethylcyclopentadienylindium $(InC_5(CH_3)_5)$ and tetramethyl-n-propylcyclopentadienylindium $(InC_5(CH_3)_4(n-C_3H_7))$ are still preferable. Tetramethyl-n-propylcyclopentadienylindium $(InC_5(CH_3)_4(n-C_3H_7))$ is particularly preferable.

Specific examples of the compound represented by the general formula (3) include cyclopentadienylgallium (I), methylcyclopentadienylgallium (I), ethylcyclopentadienylgallium (I), n-propylcyclopentadienylgallium (I), isopropylcyclopentadienylgallium (I) and t-butylcyclopentadienylgallium (I).

Specific examples of the compound represented by the general formula (4) include bis(cyclopentadienyl)zinc, bis(methylcyclopentadienyl)zinc, bis(ethylcyclopentadienyl)zinc, bis(n-propylcyclopentadienyl)zinc, bis(isopropylcyclopentadienyl)zinc, bis(t-butylcyclopentadienyl)zinc, bis(cyclopentadienyl)tin, bis(methylcyclopentadienyl)tin, bis(ethylcyclopentadienyl)tin, bis(n-propylcyclopentadienyl)tin, bis(isopropylcyclopentadienyl)tin and bis(t-butylcyclopentadienyl)tin. Bis(ethylcyclopentadienyl) zinc and bis(ethylcyclopentadienyl)tin are still preferable.

Specific examples of the compound represented by the general formula (5) include tetramethylcyclopentadienylgallium ($GaC_5H(CH_3)_4$), pentamethylcyclopentadienylgallium ($GaC_5$ ($CH_3$)), tetramethyl-ethylcyclopentadienylgallium ($GaC_5(CH_3)_4(C_2H_5)$), tetramethyl-n-propylcyclopentadienylgallium ($GaC_5(CH_3)_4(n-C_3H_7)$), tetramethyl-isopropylcyclopentadienylgallium ($GaC_5$ ($CH_3)_4(iso-C_3H_7)$) and tetramethyl-n-butylcyclopentadienylgallium ($GaC_5$ ($CH_3)_4$ ($n-C_4H_9$)) Pentamethylcyclopentadienylgallium ($GaC_5$ ($CH_3$)) and tetramethyl-n-propylcyclopentadienylgallium ($GaC_5(CH_3)_4(n-C_3H_7)$) are still preferable.

Specific examples of the compound represented by the general formula (6) include bis(tetramethylcyclopentadienyl) zinc ($Zn[C_5H(CH_3)_4]_2$), bis(pentamethylcyclopentadienyl) zinc ($Zn[C_5(CH_3)_5]_2$), bis(tetramethyl-ethylcyclopentadienyl)zinc ($Zn[C_5(CH_3)_4(C_2H_5)]_2$), bis(tetramethyl-n-propylcyclopentadienyl) zinc ($Zn[C_5(CH_3)_4(n-C_3H_7)]_2$), bis(tetramethyl-isopropylcyclopentadienyl)zinc ($Zn[C_5(CH_3)_4$ ($iso-C_3H_7$)$]_2$), bis(tetramethyl-n-butylcyclopentadienyl) zinc ($Zn[C_5(CH_3)_4(n-C_4H_9)]_2$), bis(tetramethylcyclopentadienyl)tin ($Sn[C_5H(CH_3)_4]_2$), bis(pentamethylcyclopentadienyl)tin ($Sn[C_5(CH_3)_5]_2$), bis(tetramethyl-ethylcyclopentadienyl)tin ($Sn[C_5(CH_3)_4(C_2H_5)]_2$), bis(tetramethyl-n-propylcyclopentadienyl) tin ($Sn[C_5(CH_3)_4(n-C_3H_7)]_2$), bis(tetramethyl-isopropylcyclopentadienyl)tin ($Sn[C_5(CH_3)_4$ ($iso-C_3H_7$)$]_2$) and bis(tetramethyl-n-butylcyclopentadienyl) tin ($Sn[C_5(CH_3)_4(n-C_4H_9)]_2$). Bis(tetramethyl-n-propylcyclopentadienyl)zinc ($Zn[C_5(CH_3)_4(n-C_3H_7)]_2$) and bis(tetramethyl-n-propylcyclopentadienyl) tin ($Sn[C_5(CH_3)_4(n-C_3H_7)]_2$) are still preferable.

It is preferable that the compound represented by the general formula (3) and/or (4) should be added to the compound represented by the general formula (1). It is preferable that the compound represented by the general formula (5) and/or (6) should be added to the compound represented by the general formula (2). In the general formulae (1), (3) and (4), R may be the same or different. In the general formulae (2), (5) and (6), R may be the same or different. In either case, R is preferably the same.

When $M^1$ is gallium, the structure represented by the general formula (5) is preferable to the one represented by the general formula (3), because of more stability.

The vapor deposition source material of the present invention comprises 0.1 mol or more, preferably 50 to 1000 mol, and still preferably 100 to 500 mol of one or more of the compounds represented by the general formulae (3) to (6) on the 100 mol basis of the compound represented by the general formula (1) or (2). The compound represented by the general formula (1) or (2) can be stabilized, including one or more of the compounds represented by the general formulae (3) to (6) in the above-described ranges.

The vapor deposition source material of the present invention may further comprise a solvent. The solvents are not restricted if only they can be appropriately used in the CVD liquid vaporization supply system. However considering stabilization of In source materials, low-polarity organic solvents are preferable, tetrahydrofuran (THF), ethylcyclohexane and toluene are still preferable, and nonaromatic organic solvents are further preferable. The total concentration of the compound represented by the general formula (1) or (2) and one or more of the compounds represented by the general formulae (3) to (6) is 0.01 wt % or more preferably and 1 wt % or more still preferably, of the total amount of the vapor deposition source material.

The compound represented by the general formula (1) or (2) and one or more of the compounds represented by the general formulae (3) to (6) are considered stabilized with structures as below in the vapor deposition source material of the present invention. In the following structural formulae, n is an integer of 0 to 3 and M represents $M^1$ or $M^2$.

[Chem. 1]

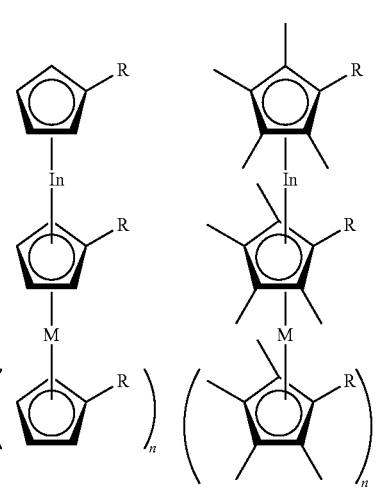

Herein, the mechanism of stabilizing the vapor deposition source material of the present invention is explained with the following example using the compound represented by the general formula (1). The compound represented by the general formula (1) being a monovalent indium compound, disproportionates to metallic indium and a trivalent indium compound, when being exposed to light and heat at room temperature.

$$3(InC_5H_4R) \rightarrow 2In + In(C_5H_4R)_3$$

When a monovalent gallium compound, for example, as a compound represented by the general formula (3) or (4) is added to and coexists with in the vapor deposition source material, the progress of the disproportionation is suppressed, which contributes to the stabilization of the compound represented by the general formula (1).

The vapor deposition source material of the present invention can produce a film containing indium and one or more of the other metals when being subjected to chemical vapor deposition methods, such as thermal CVD, metal organic chemical vapor deposition (MOCVD), low-pressure chemical vapor deposition (LPCVD), plasma-enhanced chemical vapor deposition (PECVD) and atomic layer deposition (ALD).

A compound volatile even at low temperature is necessary for the precursor in order to form a film by these chemical vapor deposition methods. In this respect, all of tetramethyl-n-propylcyclopentadienylindium ($InC_5(CH_3)_4(n-C_3H_7)$), tetramethyl-n-propylcyclopentadienylgallium ($GaC_5(CH_3)_4(n-C_3H_7)$) and bis(tetramethyl-n-propylcyclopentadienyl) zinc ($Zn[C_5(CH_3)_4(n-C_3H_7)]_2$) are liquid at room temperature (23° C.) and have high vapor pressure even at low temperature. Therefore these compounds are suitable for the CVD.

A method of forming a film by chemical vapor deposition (CVD) using a vapor deposition source material containing $InC_5(CH_3)_4(n-C_3H_7)$ and $GaC_5(CH_3)_4(n-C_3H_7)$ is described as an example. In CVD, a source material container filled with the vapor deposition source material is heated to vaporize and the vapor is fed into a reaction chamber. The evaporation can be performed by a common method of vaporizing an organometallic compound used for CVD, such as heating and reducing pressure of a source material container in the CVD system. In order to feed the vapor deposition source material into the substrate in the reaction chamber, the temperature of a supply pipe that connects the source material container with a reaction chamber and the reaction chamber needs to be set at a temperature where source materials, namely $InC_5(CH_3)_4(n-C_3H_7)$ and $GaC_5(CH_3)_4(n-C_3H_7)$ do not thermally decompose but maintain a gaseous state; in other words, a temperature that is higher than the temperature of the source material container (i.e., the vaporization temperature of the source material) and lower than the thermal decomposition temperature of the source material. The heating temperature should be set at approximately 23 to 200° C. when the foregoing vapor deposition source material is used. To enlarge the range of temperature for film formation, i.e., the substrate temperature, it is desirable that the temperature of the vapor deposition container be as low as possible. In the respect that $InC_5(CH_3)_4(n-C_3H_7)$ and $GaC_5(CH_3)_4(n-C_3H_7)$ have sufficiently high vapor pressure even at low temperature, they are suitable for CVD. In general, when a film containing indium and one or more of the other metals is formed by thermal CVD as described above, each metal source material is prepared individually, and in control of the vaporization rate and the flow rate of each metal source material, a mixed gas needs to be fed into a reaction chamber so as to obtain a film having a desired composition. However, as to the source material of the present invention, it is not necessary to control the vaporization rate and the flow rate individually if only each composition is adjusted in advance, which makes management easier. In the case of mass production by CVD, the injection method is often applied to vaporize and feed only the required amount of the liquid material in liquid state under the direct flow rate control. The advantage of the present invention is that the source material can form a film using only one vaporizer, even in the case of forming a film containing two kinds or more metals. When the injection method is applied to a solid material, the solid material needs to be dissolved in a solvent. The solid material of the present invention keeps stability even when dissolved in a solvent, which is suitable.

The source material of the present invention can be applied to atomic layer deposition (ALD) which is a layer-by-layer deposition technique, a type of the CVD. In forming a film containing indium and one or more of the other metals by ALD, each metal source material is usually prepared individually, and the number of cycles in ALD is controlled so as to obtain a film with a desired composition, which is so-called the supercycle method. However, the supercycle method inevitably makes the composition layered. In the present invention, the mixed gas can be fed in a constant composition ratio, so that the film quality is easily controlled, which is particularly favorable. Even though the supercycle method is not used, it is possible to prepare each metal source material individually, and then feed a mixed gas thereof into a reaction chamber in control of the vaporization rate and the flow rate of each metal source material so that a film with a desired composition can be obtained, likewise in the thermal CVD, whose manipulation is not easy, though.

EXAMPLES

Hereinafter, the present invention will be described in detail with reference to examples, but the present invention is not restricted to the examples.

[Synthetic Example 1] Synthesis of tetramethyl-n-propylcyclopentadienylindium $(InC_5(CH_3)_4(n-C_3H_7))$ To a 1 L four-necked flask were added 400 mL of hexane, 82 mL (1.6 mol/L, 0.13 mol) of n-butyllithium-hexane solution and 29.04 g (0.17 mol) of tetramethyl-n-propylcyclopentadiene, and the mixture was reacted for 20 hours at room temperature. Distillation at 40° C. under reduced pressure provided $C_5(CH_3)_4(n-C_3H_7)Li$.

To $C_5(CH_3)_4(n-C_3H_7)Li$ thus obtained, 400 mL of toluene and 17.84 g (0.12 mol) of indium (I) chloride were added at −78° C., and the mixture was stirred at room temperature for 20 hours and then was filtered out. Distillation of the obtained solution at 40° C. under reduced pressure provided a solution.

The obtained solution was put into a single type distillation apparatus, and distilled twice at 60° C. and 0.2 torr under vacuum to give 20.06 g (0.07 mol) of yellow liquid in 60% yield (based on InCl).

For the obtained sample, $InC_5(CH_3)_4(n-C_3H_7)$ was assigned by 1H-NMR and $^{13}$C-NMR analyses.

$^1$H NMR
Measurement condition: AVANCE NEO 500 (500 MHz), Bruker BioSpin; THF-$d_8$ solvent; and 1D method
2.45 (2H, triplet) ppm, 2.06 (6H, singlet) ppm, 2.05 (6H, singlet) ppm, 1.41 (2H, sextet) ppm, 0.93 (3H, triplet) ppm
$^{13}$C-NMR
Measurement condition: AVANCE NEO 500 (125 MHz), Bruker BioSpin; THF-$d_8$ solvent; and 1D method
120.39, 113.41, 28.11, 27.93, 14.53, 10.26 ppm

[Synthetic Example 2] Synthesis of tetramethyl-n-propylcyclopentadienylgallium $(GaC_5(CH_3)_4(n-C_3H_7))$ To a 1 L four-necked flask were added 500 mL of toluene, 15.72 g (0.40 mol) of metallic potassium and 70.61 g (0.43 mol) of tetramethyl-n-propylcyclopentadiene, and the mixture was reacted for 3 days at room temperature. Distillation at 100° C. under reduced pressure provided $C_5(CH_3)_4C_3H_7K$.

To a 300 mL three-necked flask were added 25.01 g (0.36 mol) of metallic gallium and 45.72 g (0.18 mol) of I2, and the mixture was stirred at reflux for 2 days to give a suspension of GaI.

To $C_5(CH_3)_4C_3H_7K$ thus obtained, 300 ml of toluene and the suspension of GaI were added at −78° C., and the mixture was stirred at room temperature for 19 hours and then was filtered out. Distillation of the obtained solution at 40° C. under reduced pressure provided a solution.

The obtained solution was put into a single type distillation apparatus, and distilled twice at 60° C. and 0.2 torr under vacuum to give 44.63 g (0.19 mol) of yellow liquid in 53% yield (based on Ga).

For the obtained sample, $GaC_5(CH_3)_4(n-C_3H_7)$ was assigned by 1H-NMR and $^{13}$C-NMR analyses.

$^1$H NMR
Measurement condition: AVANCE NEO 500 (500 MHz), Bruker BioSpin; THF-$d_8$ solvent; and 1D method 2.40 (2H, triplet) ppm, 2.00 (6H, singlet) ppm, 1.99 (6H, singlet) ppm, 1.43 (2H, sextet) ppm, 0.93 (3H, triplet) ppm
$^{13}$C-NMR
Measurement condition: AVANCE NEO 500 (125 MHz), Bruker BioSpin; THF-$d_8$ solvent; and 1D method
119.96, 113.71, 113.66, 27.54, 26.61, 14.42, 9.79, 9.77 ppm To examine the stabilizing effect by mixing, tetramethyl-n-propylcyclopentadienylindium, tetramethyl-n-propylcyclopentadienylgallium, bis(tetramethyl-n-propylcyclopentadienyl)zinc, tetrahydrofuran, ethylcyclohexane and toluene were mixed in the proportions shown in Table 1, and the stability of the obtained solutions was evaluated according to the following criteria.

Excellent: no color change or precipitation was observed on the third day.
Good: the solution was yellow on the third day but solid precipitation was slightly observed.
Poor: the solution turned brown on the third day and gray solids precipitated.

TABLE 1

| InCppm /g | GaCppm | | Zn (Cppm)$_2$ | | Tetrahydrofuran /g | Ethylcyclohexane /g | Toluene /g | Results | |
|---|---|---|---|---|---|---|---|---|---|
| | /g | Molar Ratio (Ga/In) | /g | Molar Ratio (Zn/In) | | | | | |
| 0.10 | 0.06 | 0.72 | — | | 0.16 | — | — | Excellent | Ex. 1 |
| 0.10 | 0.04 | 0.48 | — | | 0.14 | — | — | Good | Ex. 2 |
| 0.10 | — | | 0.15 | 1.06 | 0.25 | — | — | Excellent | Ex. 3 |
| 0.10 | — | | 0.11 | 0.78 | 0.21 | — | — | Good | Ex. 4 |
| 0.44 | 0.38 | 1.03 | 0.63 | 1.02 | — | — | — | Excellent | Ex. 5 |
| 1.46 | 1.26 | 1.03 | 2.11 | 1.03 | 25.17 | — | — | Excellent | Ex. 6 |
| 1.46 | 1.26 | 1.03 | 2.11 | 1.03 | — | 25.17 | — | Excellent | Ex. 7 |
| 1.46 | 1.26 | 1.03 | 2.11 | 1.03 | — | — | 25.17 | Good | Ex. 8 |
| 0.10 | — | | — | | — | — | — | Poor | Comp. Ex. 1 |
| 0.10 | — | | — | | 0.10 | — | — | Poor | Comp. Ex. 2 |

InCppm: tetramethyl-n-propylcyclopentadienylindium, GaCppm: tetramethyl-n-propylcyclopentadienylgallium, and Zn (Cppm)$_2$: bis(tetramethyl-n-propylcyclopentadienyl) zinc Ethylcyclopentadienylindium, bis (ethylcyclopentadienyl) tin and tetrahydrofuran were mixed in the proportions shown in Table 2, and the stability of the obtained solutions was evaluated according to the following criteria.
Excellent: no color change or precipitation was observed on the third day.
Poor: gray solids were observed to precipitate on the third day.

TABLE 2

| InEtCp/ g | Sn(EtCp)$_2$ | | Tetrahydrofuran/g | Results | |
|---|---|---|---|---|---|
| | /g | Molar Ratio | | | |
| 0.11 | 0.16 | 0.99 | — | Excellent | Ex. 9 |
| 0.10 | 0.15 | 1.02 | 0.25 | Excellent | Ex. 10 |
| 0.30 | — | — | — | Poor | Comp. Ex. 3 |
| 0.34 | — | — | 0.34 | Poor | Comp. Ex. 4 |

InEtCp: ethylcyclopentadienylindium,
Sn(EtCp)$_2$: bis(ethylcyclopentadienyl)tin Methods of preparing the vapor deposition source materials of Examples 1 to 11 and Comparative Examples 1 to 4 and the evaluation results are shown below.

Example 1

Tetramethyl-n-propylcyclopentadienylindium (InC$_5$(CH$_3$)$_4$(n-C$_3$H$_7$)) (0.10 g, 0.36 mmol), tetramethyl-n-propylcyclopentadienylgallium (GaC$_5$(CH$_3$)$_4$(n-C$_3$H$_7$)) (0.06 g, 0.26 mmol) and tetrahydrofuran (THF) (0.16 g, 2.2 mmol) were mixed and poured into a glass container. The glass container was heat-sealed and the solution kept at 30° C. was observed to change.

No color change or precipitation was observed even after 6 days.

Example 2

Tetramethyl-n-propylcyclopentadienylindium (0.10 g, 0.36 mmol), tetramethyl-n-propylcyclopentadienylgallium (0.04 g, 0.17 mmol) and tetrahydrofuran (THF) (0.14 g, 1.9 mmol) were mixed and poured into a glass container. The glass container was heat-sealed and the solution kept at 30° C. was observed to change.

After a week, the solution showed no change from yellow, while solid precipitation was slightly observed.

Example 3

Tetramethyl-n-propylcyclopentadienylindium (0.10 g, 0.36 mmol), bis(tetramethyl-n-propylcyclopentadienyl)zinc (Zn[C$_5$(CH$_3$)$_4$(n-C$_3$H$_7$)]$_2$) (0.15 g, 0.38 mmol) and tetrahydrofuran (0.25 g, 3.5 mmol) were mixed and poured into a glass container. The glass container was heat-sealed and the solution kept at 30° C. was observed to change.

No color change or precipitation was observed even after 6 days.

Example 4

Tetramethyl-n-propylcyclopentadienylindium (0.10 g, 0.36 mmol), bis(tetramethyl-n-propylcyclopentadienyl)zinc (0.11 g, 0.28 mmol) and tetrahydrofuran (0.21 g, 2.9 mmol) were mixed and poured into a glass container. The glass container was heat-sealed and the solution kept at 30° C. was observed to change.

Even after a week, the solution showed no change from yellow, while solid precipitation was slightly observed.

Example 5

Tetramethyl-n-propylcyclopentadienylindium (0.44 g, 1.6 mmol), tetramethyl-n-propylcyclopentadienylgallium (0.38 g, 1.6 mmol) and bis(tetramethyl-n-propylcyclopentadienyl)zinc (0.63 g, 1.6 mmol) were mixed and poured into a glass container. The glass container was heat-sealed and the solution kept at 30° C. was observed to change.

Even after a week, the solution showed no change from yellow and no solid precipitated.

Example 6

Tetramethyl-n-propylcyclopentadienylindium (1.46 g, 5.3 mmol), tetramethyl-n-propylcyclopentadienylgallium (1.26 g, 5.4 mmol), bis(tetramethyl-n-propylcyclopentadienyl)zinc (2.11 g, 5.4 mmol) and tetrahydrofuran (25.17 g, 349 mmol) were mixed and poured into a glass container. The glass container was heat-sealed and the solution kept at 30° C. was observed to change.

Even after a week, the solution showed no change from yellow and no solid precipitated.

Example 7

Tetramethyl-n-propylcyclopentadienylindium (1.46 g, 5.3 mmol), tetramethyl-n-propylcyclopentadienylgallium (1.26 g, 5.4 mmol), bis(tetramethyl-n-propylcyclopentadienyl)zinc (2.11 g, 5.4 mmol) and ethylcyclohexane (25.17 g, 224 mmol) were mixed. The mixed solution was distilled and a total fraction of evaporation was collected. A part of the collected solution was poured into a glass container. The glass container was heat-sealed and the solution kept at 30° C. was observed to change.

No color change or precipitation was observed even after 3 months.

Example 8

Tetramethyl-n-propylcyclopentadienylindium (1.46 g, 5.3 mmol), tetramethyl-n-propylcyclopentadienylgallium (1.26 g, 5.4 mmol), bis(tetramethyl-n-propylcyclopentadienyl)zinc (2.11 g, 5.4 mmol) and toluene (25.17 g, 273 mmol) were mixed and poured into a glass container. The glass container was heat-sealed and the solution kept at 30° C. was observed to change.

Even after a week, the solution showed no change from yellow, while only a little solid was observed to precipitate.

Example 9

Ethylcyclopentadienylindium (InEtCp) (0.11 g, 0.53 mmol) and bis(ethylcyclopentadienyl)tin (Sn(EtCp)$_2$) (0.16 g, 0.52 mmol) were mixed and poured into a glass container. The glass container was heat-sealed and the solution kept at 30° C. was observed to change.

No color change or precipitation was observed even after 3 days.

Example 10

Ethylcyclopentadienylindium (InEtCp) (0.10 g, 0.48 mmol), bis(ethylcyclopentadienyl)tin (Sn(EtCp)$_2$) (0.15 g, 0.48 mmol), and tetrahydrofuran (0.25 g, 3.4 mmol) were mixed and poured into a glass container. The glass container was heat-sealed and the solution kept at 30° C. was observed to change.

No color change or precipitation was observed even after 3 days.

Example 11

A solution which was prepared in a manner similar to Example 7 was partially wet degraded. The ICP emission spectrometry of the resulting liquid confirmed that contents of In, Ga and Zn were 1.78%, 1.10% and 1.05%, respectively (theoretical value: In 2.01%, Ga 1.26%, Zn 1.17%).

The mixed solution was distilled and a volatile fraction was thoroughly collected. The ICP emission spectrometry of a liquid obtained after wet degradation of the collected solution confirmed that contents of In, Ga and Zn were 1.85%, 1.15% and 1.09%, respectively.

These results show that the mixing ratio of the source material remains unchanged before and after volatilization, and indicate that the liquid is suitable for use as the chemical vapor deposition source material.

Comparative Example 1

Tetramethyl-n-propylcyclopentadienylindium (0.10 g, 0.36 mmol) was poured into a glass container. The glass container was heat-sealed and the solution kept at 30° C. was observed to change.

After a day, the solution turned brown and gray solids precipitated.

Comparative Example 2

Tetramethyl-n-propylcyclopentadienylindium (0.10 g, 0.36 mmol) and tetrahydrofuran (0.10 g, 1.39 mmol) were poured into a glass container. The glass container was heat-sealed and the solution kept at 30° C. was observed to change.

The solution turned black in a few minutes. After a day, the solution remained black and gray solids precipitated.

Comparative Example 3

Ethylcyclopentadienylindium (InEtCp) (0.30 g, 1.44 mmol) was poured into a glass container. The glass container was heat-sealed and the solution kept at 30° C. was observed to change.

Gray solids precipitated after a day.

Comparative Example 4

Ethylcyclopentadienylindium (InEtCp) (0.34 g, 1.63 mmol) and tetrahydrofuran (0.34 g, 4.72 mmol) were poured into a glass container. The glass container was heat-sealed and the solution kept at 30° C. was observed to change.

Gray solids precipitated after a day.

The invention claimed is:

1. A chemical vapor deposition source material used in production of a film containing indium and one or more of the other metals, comprising:
    a compound represented by the following general formula (1) or (2),
    one or more compounds represented by the following general formulae (3) to (6), and
    a solvent,
    wherein the chemical vapor deposition source material comprises not less than 0.1 mol of the one or more compounds represented by the following general formulae (3) to (6) on the 100 mol basis of the compound represented by the following general formula (1) or (2), and
    wherein the total concentration of the compound represented by the general formula (1) or (2), and the one or more of the compounds represented by the general formulae (3) to (6) is 0.01 wt % or more:

$$M^1(C_5H_4R) \quad (3)$$

$$M^2(C_5H_4R)_n \quad (4)$$

$$M^1(C_5(CH_3)_4R) \quad (5)$$

$$M^2(C_5(CH_3)_4R)_n \quad (6)$$

in the general formulae (1) to (6), each R is independently a hydrogen atom or an alkyl group having 1 to 6 carbon atoms, in the general formulae (3) and (5), $M^1$ is a metal excluding indium, in the general formulae (4) and (6), $M^2$ is a metal excluding indium, and n is an integer of 2 to 4.

2. The chemical vapor deposition source material according to claim 1, comprising the compound represented by the general formula (1), and the compound represented by the general formula (3) and/or (4), or comprising the compound represented by the general formula (2), and the compound represented by the general formula (5) and/or (6);

provided, however, that R is the same in the general formulae (1) to (6).

3. A method of producing a film containing indium and one or more of the other metals, wherein an indium-containing oxide film is formed using the chemical vapor deposition source material according to claim 1 by chemical vapor deposition.

* * * * *